United States Patent
Obergrussberger et al.

(10) Patent No.: US 6,859,398 B2
(45) Date of Patent: Feb. 22, 2005

(54) SEMICONDUCTOR MEMORY COMPONENT

(75) Inventors: Franz-Xaver Obergrussberger, Pleiskirchen (DE); Andreas Bänisch, München (DE); Ellen Toll, Aying (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/692,636

(22) Filed: Oct. 24, 2003

(65) Prior Publication Data

US 2004/0111545 A1 Jun. 10, 2004

Related U.S. Application Data

(63) Continuation of application No. PCT/DE02/01504, filed on Apr. 24, 2002.

(30) Foreign Application Priority Data

Apr. 24, 2001 (DE) .......................................... 101 20 054

(51) Int. Cl.$^7$ ................................................ G11C 7/00
(52) U.S. Cl. .............................. 365/189.01; 365/230.01
(58) Field of Search .......................... 365/189.01, 227, 365/230.01, 205, 191, 189.1, 189.07

(56) References Cited

U.S. PATENT DOCUMENTS

| | | | |
|---|---|---|---|
| 4,035,783 A | | 7/1977 | Mathewson |
| 4,160,273 A | | 7/1979 | Marlowe et al. |
| 4,920,411 A | * | 4/1990 | Miyakawa ................... 358/523 |
| 5,483,050 A | * | 1/1996 | Fukasawa .................... 235/449 |
| 5,673,048 A | | 9/1997 | Kearney et al. |
| 6,055,500 A | * | 4/2000 | Terui et al. ................. 704/270 |
| 6,433,617 B1 | | 8/2002 | Feurle |

FOREIGN PATENT DOCUMENTS

| | | |
|---|---|---|
| EP | 1 091 405 A2 | 4/2001 |
| GB | 2 352 072 A | 1/2001 |

* cited by examiner

*Primary Examiner*—Thong Q. Le
(74) *Attorney, Agent, or Firm*—Laurence A. Greenberg; Werner H. Stemer; Ralph E. Locher

(57) ABSTRACT

A plurality of digital-analog converters and analog-digital converters are connected in the data lines between the connection contacts and the memory cells of a memory device. The memory can be read, written to and actuated by analog data transfers instead of the previous digital signals. The same volume of data, for which a plurality of connection contact areas were normally required, can thus be read via just one connection contact. Addressing the memory cells requires no more than respective contact areas for the analog row address and the analog column address, which are converted into digital addresses using analog-digital converters.

4 Claims, 2 Drawing Sheets

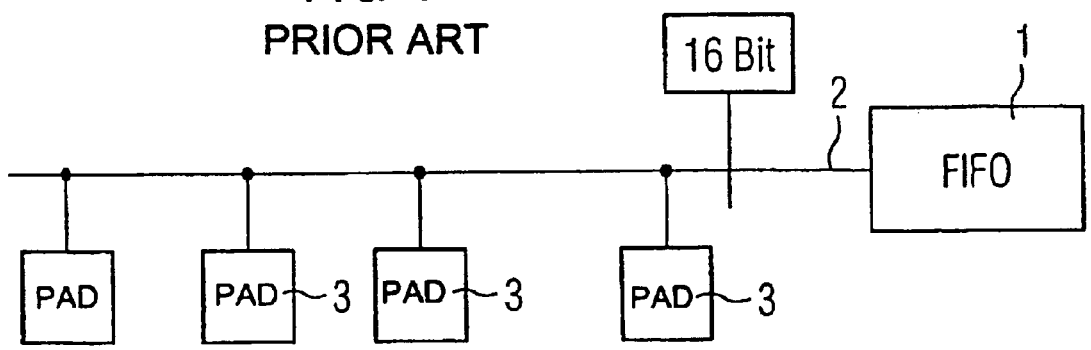
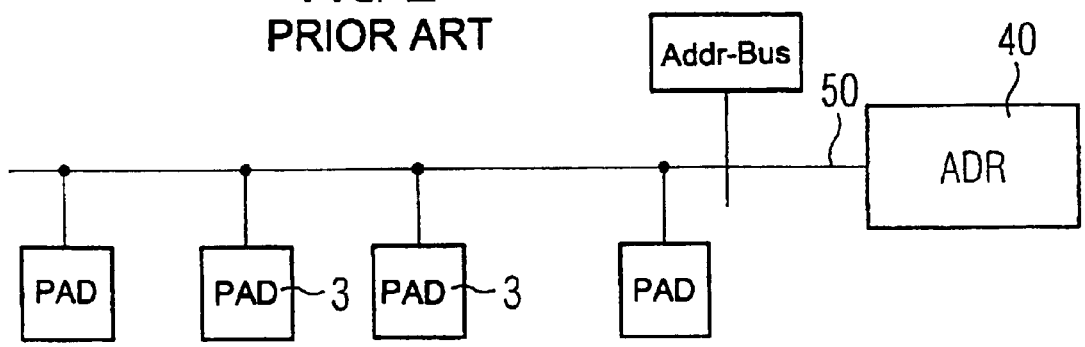
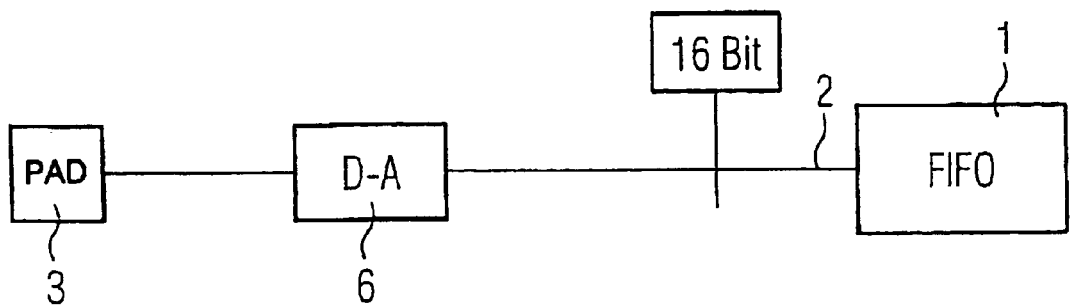

SEMICONDUCTOR MEMORY COMPONENT

CROSS-REFERENCE TO RELATED APPLICATION

This application is a continuation of copending International Application No. PCT/DE02/01504, filed Apr. 24, 2002, which designated the United States and which was not published in English.

BACKGROUND OF THE INVENTION

FIELD OF THE INVENTION

The invention lies in the semiconductor technology and memory technology field. More specifically, the invention relates to a semiconductor memory component. In such components, a semiconductor memory is produced on a chip as a configuration of memory cells. An integrated circuit allows the semiconductor memory to be used, in particular the individual memory cells to be addressed. Electrically conductive connections in the form of word lines and bit lines set up the connection between the connections provided for actuating the memory cells and the memory cells and are provided for programming the memory cells. Programming and reprogramming the memory cells store digital information in the cells in the form of logic 0 or logic 1. The information is read in a prescribed manner when the memory cells are addressed.

The stored data are input and output, and the control signals provided for addressing or for generally controlling use of the memory are input, in the form of digital input signals and output signals. Since the information content of the individual bit is extremely small, a multiplicity of such signals need to be transmitted in parallel or serially. Ordinary semiconductor memory chips are therefore provided with a very large number of connection contacts. This results in high costs for the packages in which the semiconductor memory chips are mounted.

Such a package comprises, by way of example, a patterned metal support which likewise holds a corresponding number of connection contacts. These contacts need to be connected in pairs to the corresponding contacts on the memory chip. Since each data output is able to output just one value at any time, this results only a low data rate.

When the memory cells are arranged in the semiconductor memory in matrix form, the bit lines and word lines need to be used to address the rows and columns in this memory cell matrix at offset times. This results in long access times. The number of connection contact areas required therefore rises very sharply as the size of the memory increases. The latter, however, is the object of the progressing technology. By limiting the possible number of connection contacts, the capacity limit of the memory chip is reached very quickly.

SUMMARY OF THE INVENTION

It is accordingly an object of the invention to provide a semiconductor memory component, which overcomes the above-mentioned disadvantages of the heretofore-known devices and methods of this general type and which provides for a semiconductor memory component with short access times or high data rates even when the memory capacity is high.

With the foregoing and other objects in view there is provided, in accordance with the invention, a semiconductor component with a semiconductor chip that has a semiconductor memory with a memory array of a plurality of memory cells. The device has:

at least one connection contact;
an electrically conductive connection between the at least one connection contact and the semiconductor memory;
at least one converter device selected from the group consisting of a digital-analog converter and an analog-digital converter incorporated in the electrically conductive connection for enabling a utilization of the semiconductor memory with analog signals; and
wherein a number of the connection contacts for the semiconductor chip is less than a number of connection contacts required for a utilization of the semiconductor memory with digital signals.

In other words, the inventive component is provided with at least one digital-analog converter and/or at least one analog-digital converter, specifically preferably a plurality of such converters, which are incorporated into the electrically conductive connections between the connection contacts and the memory cells such that it is possible to use the semiconductor memory by inputting or outputting analog signals. The analog signals are equivalent to superimposition of a multiplicity of digital signals.

If analog outputs are provided instead of the previous digital outputs in a semiconductor memory, therefore, the same volume of data, for which a plurality of connection contact areas (pads) were normally required, can be read via just one connection contact. The data can be written in by inputting the data in the form of analog signals and using an analog-digital converter to convert them into a plurality of digital signals, which are forwarded in an ordinary 16-bit bus, for example.

The same principle can also be applied to addressing the memory cells. In this regard, the connection contact areas for inputting the addressing signals are replaced by a smaller number of connection contact areas, particularly two contact areas for the row address and the column address, and analog-digital converters are provided behind them for the purpose of converting the analog control signals which are input on the connection contact areas into digital addressing signals. This component therefore saves a very large number of connection contact areas on the semiconductor chip, and also on the package, in particular. In addition, a faster interface is obtained for the data and addresses.

Other features which are considered as characteristic for the invention are set forth in the appended claims.

Although the invention is illustrated and described herein as embodied in a semiconductor memory component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 and 2 are diagrams showing two connection schemes for semiconductor memories in the prior art; and FIGS. 3 to 5 are similar views showing corresponding connection schemes for examples of the component in accordance with the invention.

DESCRIPTION OF THE PREFERRED EMBODIMENTS

Figure 4:
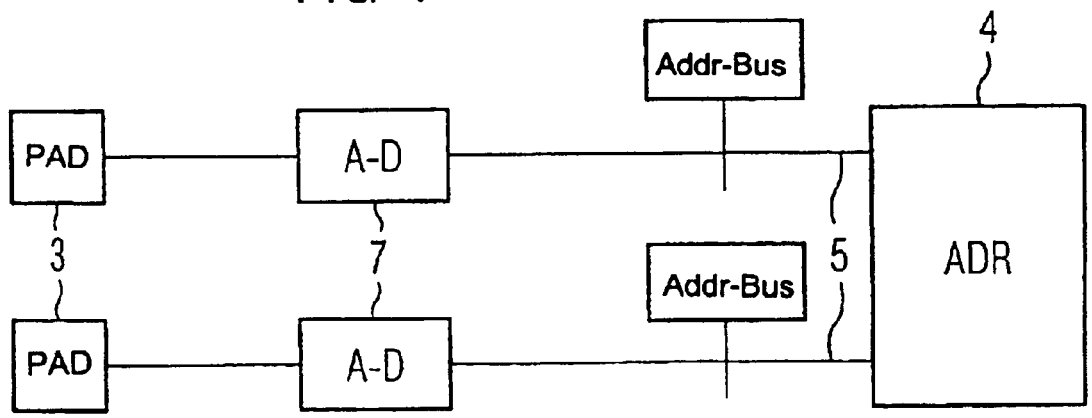

Referring now to the figures of the drawing in detail and first, particularly, to FIG. 1 thereof, there is shown an exemplary component with a connection scheme in which, on the basis of the prior art, a semiconductor memory 1, in this case an FIFO memory, is connected to connection contact areas 3 via an ordinary 16-bit data line 2. The connection contact areas can be used for tapping off the digital data transmitted in parallel when the memory 1 is read.

FIG. 2 shows a corresponding scheme for addressing the semiconductor memory based on the prior art. In this case, addressing latches 40 are shown which are controlled via an address bus 50 with the digital signals that are input on the connection contact areas 3. The connection contact areas (address pads) have a row address and then a strobe signal (row address strobe) applied to them, as a result of which the row address is stored in the latches. The column address is then applied to the same connection contact areas 3. A strobe signal (column address strobe) is applied again, as a result of which the column address is stored in the latches.

FIG. 3 shows a scheme, corresponding to that in FIG. 1, according to which a component in accordance with the invention allows the memory content to be read. The semiconductor memory 1 has a multiplicity of data lines coming from it, in the form of 16-bit data lines 2 in the exemplary illustration. Instead of being routed directly to the connection contact area 3, the data lines incorporate a digital-analog converter 6 which converts the digital signals into an analog signal. This analog signal can be tapped off on a common connection contact area 3.

If certain exemplary embodiments of the component do not allow all the signals on a 16-bit data bus to be superimposed to form an analog signal, it is also possible for a plurality of connection contact areas 3 to be provided which are supplied with a respective analog signal formed from partial superimposition of the digital signals. In addition, the use of parallel data buses for the converted, analog signals allows faster transmission of the data.

The inventive memory component is addressed in the manner shown by the scheme shown in FIG. 4. In this example, just one respective connection contact area is provided for row addressing and column addressing. These contact areas can have the analog control signals applied to them, which are each subsequently converted in an analog-digital converter 7 into the digital signals, which are supplied to the address latches 4 via a respective address bus 5.

Figure 5:
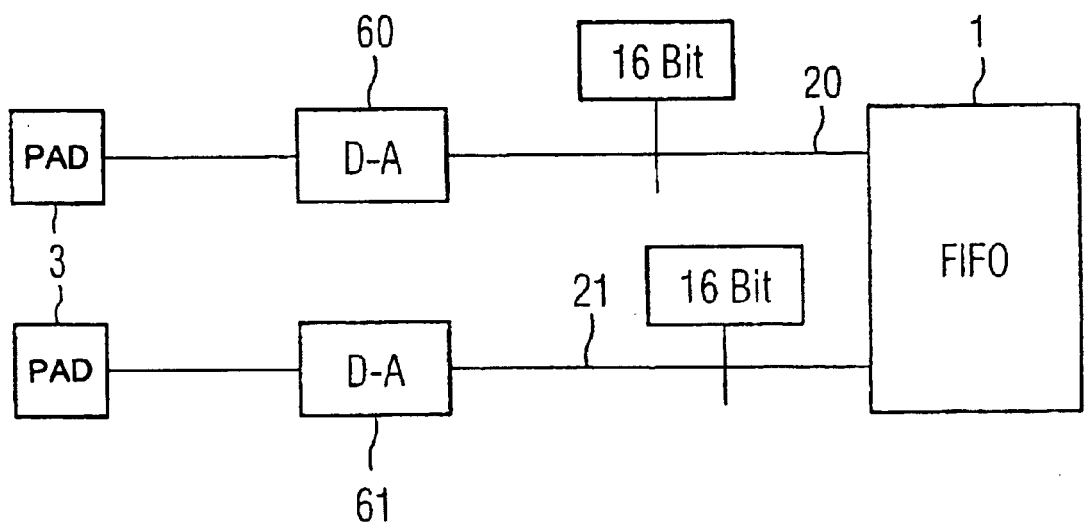

FIG. 5 shows a further exemplary embodiment using a scheme corresponding to that in FIG. 3. This exemplary embodiment illustrates that a plurality of 16-bit data buses 20, 21, of which two are shown in this case, can be converted in parallel into analog signals using digital-analog converters 60, 61, said analog signals being supplied to the connection contact areas 3. This means that it is possible to transmit an even greater number of data in parallel without the number of connection contact areas 3 exceeding a tolerable limit.

The inventive component can be in a form such that read and write operations are possible by outputting and inputting analog data. Instead of the data which are to be stored or are stored, it is also possible to transmit control signals for controlling read and write operations, particularly for addressing memory locations, by inputting analog control signals.

In one preferred refinement of the component, both, i.e. the read and write operations and control thereof, are performed exclusively by inputting and outputting analog signals. In this refinement, communication with a memory controller is therefore effected exclusively using analog signals.

If a plurality of connection contact areas are provided for data input and data output, the transmitted data rates can be significantly increased. With a connection contact area and a 16-bit digital-analog converter, for example, 16 bits per clock cycle can be transmitted during a read operation; the same data rate is achieved with two 8-bit digital-analog converters and two connection contact areas. By using digital-analog converters of suitable capacity and a sufficiently large number of connection contact areas, much higher data rates can therefore be transmitted as compared with conventional memory components.

In this case, conversion between digital and analog signals is respectively performed such that the relevant information is retained. The number of digital signals which is superimposed to form analog signals must therefore possibly be subject to appropriate restriction for certain applications of the inventive component. Since it is possible to convert a plurality of digital signals into an analog signal or to convert an analog signal into a plurality of digital signals in all cases, however, it is possible to save a large number of connection contact areas with the inventive memory component in any exemplary embodiment.

We claim:

1. A semiconductor component, comprising:

a semiconductor chip with a semiconductor memory having an array with a plurality of memory cells;

at least one connection contact;

an electrically conductive connection integrated into said semiconductor chip between said at least one connection contact and said semiconductor memory;

at least one converter device selected from the group consisting of a digital-analog converter and an analog-digital converter integrated into said semiconductor chip and incorporated in said electrically conductive connection for enabling a utilization of said semiconductor memory with analog signals; and wherein a number of said connection contacts for said semiconductor chip is less than a number of connection contacts required for a utilization of said semiconductor memory with digital signals.

2. The component according to claim 1, wherein said at least one converter device includes digital-analog converters and analog-digital converters disposed to enable read and write operations by outputting and inputting analog data.

3. The component according to claim 1, wherein said at least one converter device includes at least one analog-digital converter disposed to enable control of read and write operations and/or to address memory locations by inputting analog control signals.

4. The component according to claim 1, wherein said at least one converter device includes digital-analog converters and analog-digital converters disposed to enable both read and write operations and control thereof by outputting and inputting exclusively analog data and by inputting exclusively analog control signals.

* * * * *